US006764885B2

(12) United States Patent
Huang et al.

(10) Patent No.: US 6,764,885 B2
(45) Date of Patent: Jul. 20, 2004

(54) METHOD OF FABRICATING TRANSISTOR DEVICE

(75) Inventors: Zhisong Huang, San Dimas, CA (US); Jaime Grunlan, Pasadena, CA (US); Pi Chang, Arcadia, CA (US)

(73) Assignee: Avery Dennison Corporation, Pasadena, CA (US)

(*) Notice: Subject to any disclaimer, the term of this patent is extended or adjusted under 35 U.S.C. 154(b) by 1 day.

(21) Appl. No.: 10/274,062

(22) Filed: Oct. 17, 2002

(65) Prior Publication Data

US 2004/0075155 A1 Apr. 22, 2004

(51) Int. Cl.[7] .............................................. H01L 21/84
(52) U.S. Cl. .................. 438/161; 438/99; 438/149; 438/151; 438/158
(58) Field of Search ..................... 438/99, 149, 151, 438/158, 167, 197

(56) References Cited

U.S. PATENT DOCUMENTS

| | | | |
|---|---|---|---|
| 4,478,769 A | | 10/1984 | Pricone et al. |
| 4,486,363 A | | 12/1984 | Pricone et al. |
| 4,601,861 A | | 7/1986 | Pricone et al. |
| 5,213,872 A | | 5/1993 | Pricone et al. |
| 5,817,550 A | * | 10/1998 | Carey et al. ............... 438/166 |
| 6,015,214 A | | 1/2000 | Heenan et al. |
| 6,335,539 B1 | * | 1/2002 | Dimitrakopoulos et al. .. 257/40 |
| 6,517,995 B1 | * | 2/2003 | Jacobson et al. ........... 430/320 |
| 2002/0149107 A1 | * | 10/2002 | Chang et al. ............... 257/741 |

FOREIGN PATENT DOCUMENTS

| | | |
|---|---|---|
| WO | 99/54936 | 10/1999 |
| WO | 00/46854 | 8/2000 |
| WO | 00/49421 | 8/2000 |
| WO | 00/49658 | 8/2000 |
| WO | 00/55915 | 9/2000 |
| WO | 00/55916 | 9/2000 |
| WO | 01/46987 | 6/2001 |

OTHER PUBLICATIONS

Sirringhaus, H., et al., *High–Resolution Inkjet Printing of All–Polymer Transistor Circuits*, SCIENCE, vol. 290 (Dec. 15, 2000), pp. 2123–2126.

Dimitrakopoulos and Mascaro, *Organic thin–film transistors: A review of recent advances*, IBM J. Res. & Dev., vol. 45 No. 1 (Jan. 2001).

Sirringhaus, Kawase and Friend, *High–Resolution Ink–Jet Printing of All–Polymer Transistor Circuits*, MRS Bulletin (Jul. 2001), pp. 539–543.

Knight, Will, Plastic microchips ahead [online], Nov. 2000 [retrieved Jul. 17, 2002]. Retrieved from the Internet: URL: http://news.zdnet.co.uk/story/0,,s2082803,00.html.

Plastic Logic, Thin Film Transistors [online] [retrieved Aug. 20, 2002]. Retrieved from the Internet: URL: http://www.plasticlogic.co.uk.thinfilmtransistors.php.

* cited by examiner

*Primary Examiner*—Tom Thomas
*Assistant Examiner*—N. Drew Richards
(74) *Attorney, Agent, or Firm*—Renner, Otto, Boisselle & Sklar, LLP

(57) ABSTRACT

A method for making a transistor device includes embossing to separate parts of a layer of electrically-conducting material, thereby separating a source and a drain. The gap between the source and the drain is filled with a semiconductor material, and the source and drain are operatively coupled to a gate to make a transistor. The electrically-conducting material and the semiconductor material may be deposited using printing processes, and the various steps in the method of making the device may be performed in one or more row-to-row operations.

35 Claims, 3 Drawing Sheets

METHOD OF FABRICATING TRANSISTOR DEVICE

TECHNICAL FIELD OF THE INVENTION

The invention relates to transistor devices in general, and in particular to semiconducting conjugated polymer thin-film transistors, and methods and systems for fabricating transistor devices.

DESCRIPTION OF THE RELATED ART

Since the invention of transistors, there has been continuing desire to reduce transistor cost, reduce transistor size, and improve performance. One approach to reducing transistor cost, while still maintaining acceptable performance for some applications, has been to produce semiconducting conjugated polymer thin-film transistors. Such devices may be produced at least in part by printing of at least some of the device layers. Such printing is described, for example, in International Publication No. WO 01/46987, which is hereby incorporated by reference in its entirety.

Nonetheless, it will be appreciated that further improvements with regard to cost, ease of manufacture, and performance of thin-film transistors, would be desirable.

SUMMARY OF THE INVENTION

According to an aspect of the invention, a method of forming a transistor device includes patterning a conductive material layer to separate a source and drain of the device.

According to another aspect of the invention, a method of making a transistor device includes: depositing an electrically-conductive material layer on a substrate; pressing an electrically-conductive material fragment of the electrically-conductive material layer into the substrate, thereby separating the electrically-conductive material layer into a source and a drain; depositing a semiconductor material into a gap between the source and the drain; and operatively coupling a gate to the source and the drain.

According to yet another aspect of the invention, a method of making a transistor device includes: embossing an electrically-conductive material layer on a substrate to separate the electrically-conductive material layer into a source and a drain; depositing a semiconductor material into a gap between the source and the drain; and forming a source contact and a drain contact. The forming includes: making a source via hole in communication with the source, and a drain via hole in communication with the drain; and filling the via holes with conductive material.

According to still another aspect of the invention, a transistor device includes a source and a drain on a substrate; a gate operatively coupled to the source and the drain; and an electrically-conductive material fragment in the substrate. The source, the drain, and the electrically-conductive material fragment all include parts of a conductive material layer.

According to a further aspect of the invention, a tool for embossing a transistor device includes a base; spacers at least partially covering a side of the base; and at least one protrusion protruding from the side of the base. The protrusion includes a thermally-conducting material that has a higher thermal conductivity than a spacer material of the spacers.

According to a further aspect of the invention, a system for making a transistor device includes at least one roller; and an embossing tool operatively coupled to the roller. The tool includes a base; spacers at least partially covering a side of the base; and at least one protrusion protruding from the side of the base. The protrusion includes a thermally-conducting material that has a higher thermal conductivity than a spacer material of the spacers.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

In the annexed drawings, which are not necessarily to scale.

DETAILED DESCRIPTION

A method for making a transistor device includes embossing to separate parts of a layer of electrically-conducting material, thereby separating a source and a drain. The gap between the source and the drain is filled with a semiconductor material, and the source and drain are operatively coupled to a gate to make a transistor. The electrically-conducting material and the semiconductor material may be deposited using printing processes, and the various steps in the method of making the device may be performed in one or more row-to-row operations.

Figure 1:
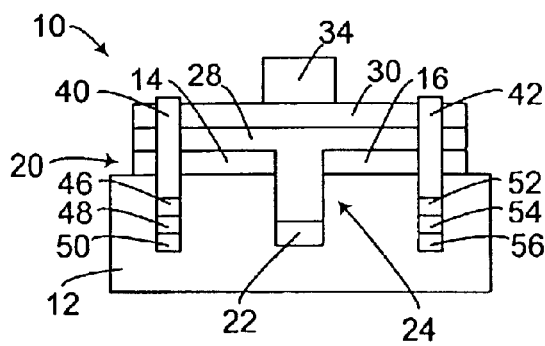
FIG. 1 is a side view of a transistor device in accordance with the present invention.

Referring to FIG. 1, a transistor device 10 is shown. The device 10 includes a substrate upon which a transistor is formed. The substrate 12 may be any of a variety of suitable flexible plastics. Examples of suitable plastics for the substrate 12 include polycarbonate, polyvinyl chloride, polystyrene, polymethyl methacrylate, polyurethane polyimide, polyester, cyclic polyolefin polymers, polyether sulfone (PES), polyethylene terephthalate (PET), polyethylene naphthalate, polycarbonate, polybutylene terephthalate, polyphenylene sulfide (PPS), polypropylene, polysulfone, aramid, polyamide-imide (PAI), polyimide, aromatic polylmides, polyetherimide, acrylonitrile butadiene styrene, and polyvinyl chloride. Further details regarding suitable substrates and substrate materials may be found in International Publication Nos. WO 00/46854, WO 00/49421, WO 00/49658, WO 00/55915, and WO 00/55916, the entire disclosures of which are herein incorporated by reference.

The substrate 12 includes a source 14 and a drain 16 thereupon. As explained in greater detail below, the source 14 and the drain 16 are formed from a layer of electrically-conducting material 20. An embossing process may be used to press a conductive material fragment 22 into and perhaps through the substrate 12, thereby separating the source 14 from the drain 16.

The material of the conductive material layer 20 may be any of a variety of suitable conductive materials. For example, the conductive material layer 20 may include a printable or sprayable material, such as a suitable conductive ink, for example an ink containing silver particles. Alternatively, it will be appreciated that other suitable conductive materials may be used, for example, materials that may be deposited via other suitable deposition methods, such as electroplating. The conductive material layer 20 may have a thickness from about 0.1 to about 20 $\mu$m (microns). However, it will be appreciated that other thicknesses may be utilized.

A gap 24 between the source 14 and the drain 16 is filled with a suitable semiconductor material 28. The semiconductor material 28 may also form a layer atop the source 14 and the drain 16. A suitable semiconductor material for the semiconductor material 28 is a suitable polymeric semiconductor material. Examples of suitable polymeric semiconductor materials are polythiophene and polyacetylene.

A gate dielectric 30 and a gate 34 are atop the semiconductor material 28. The gate dielectric may be any of a variety of suitable dielectric materials, for example, semiconductor oxides or nitrides. The gate 34 may include a semiconductor material and/or a suitable conductor such as a metal. The gate dielectric 30 is shown extending across the entire upper surface of the semiconductor material 28. However, it will be appreciated that the gate dielectric 30 alternatively may extend over only a part of the semiconductor material 28, for example, being located only under the gate 34.

The source 14, the drain 16, and the gate 34 are operatively coupled together to function as a transistor. That is, applying a sufficient voltage to the gate 34 may cause the semiconductor material 28 to conduct electricity in a channel bridging the gap 24 between the source 14 and the drain 16.

The transistor device also includes a source contact 40 and a drain contact 42. The source contact 40 provides a means to electrically connect to the source 14 from the top of the transistor device 10. Similarly, the drain contact 42 provides a way to electrically connect the drain 16 to other devices that are coupled to the transistor device 10. The source contact 40 and the drain contact 42 are formed of electrically conductive material, such as suitably-doped semiconductor material. As described in further detail below, the source contact 40 and the drain contact 42 may be formed by pushing parts of the gate dielectric 30, the semiconductor material 28, and the electrically conductive material layer 20, into the substrate 12, thus forming holes that are later filled with an electrically conductive material. Thus, as shown in FIG. 1, a source-side dielectric fragment 46, a source-side semiconductor fragment 48, and a source-side conductive material fragment 50, are all located within the substrate 12, below the source contact 40. On the other side of the gap 24, a drain-side dielectric fragment 52, a drain-side semiconductor fragment 54, and a drain-side conductive material fragment 56 are within the substrate 12, below the drain contact 42.

The transistor described above as part of the transistor device 10 may be one of a plurality of transistor devices on a single substrate 12. It will be appreciated that transistor devices such as those described above may be used in a wide variety of applications.

Figure 2:
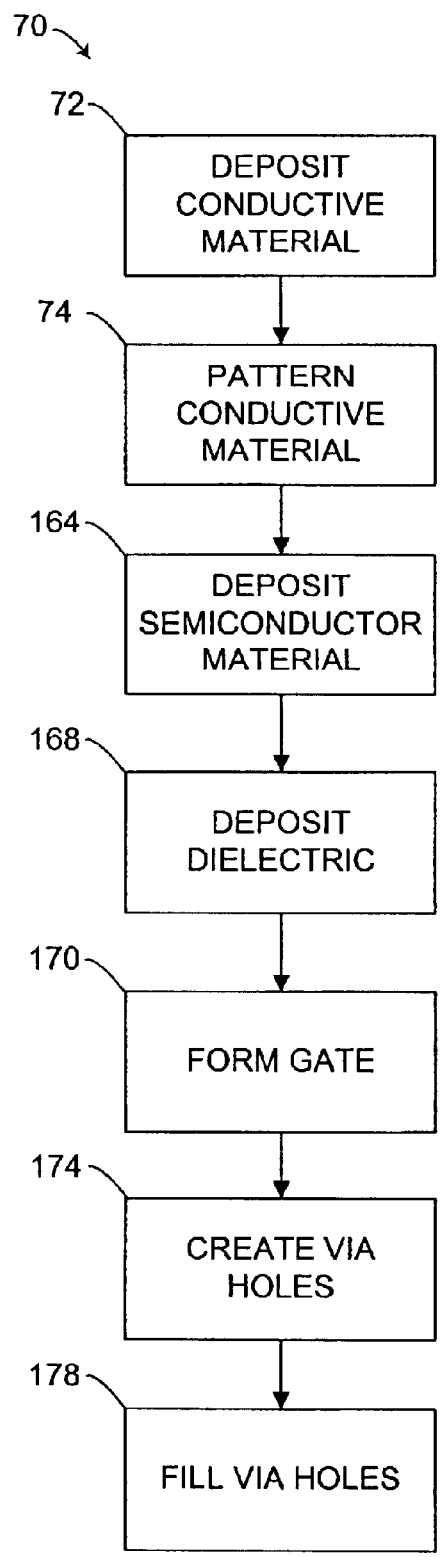
FIG. 2 a flowchart illustrating some of the steps of the manufacture of the transistor device of FIG. 1.

Turning now to FIG. 2, a general outline is shown of a method 70 for fabricating a transistor device, such as the transistor device 10 shown in FIG. 1 and described above. Beginning in step 72, conductive material is deposited on the substrate 12 to thereby form the conductive material layer 20. As noted above, the conductive material layer 20 may be a suitable conductive ink, and the conductive material layer 20 may be deposited using a suitable printing method. A wide variety of printing techniques may be used, including ink jet printing, screen printing, and Gravure printing. Alternatively, other suitable conductive materials and/or application methods may be utilized. Other suitable methods include suitable lamination processes, suitable coating processes, deposition processes such as vacuum deposition, and co-extrusion of suitable layers.

Figure 3:
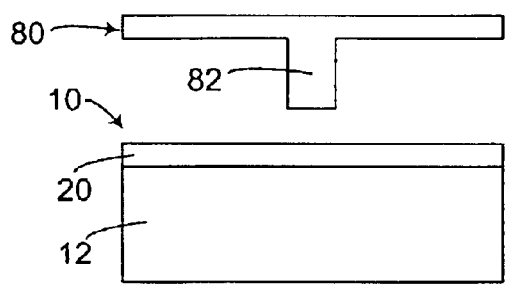
FIGS. 3, 4, and 5 illustrate embossing of the transistor device of FIG. 1 to separate the source and the drain of the device.
Figure 4:
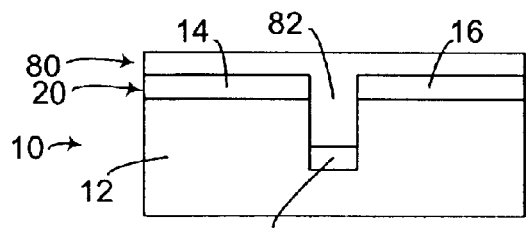
Figure 5:
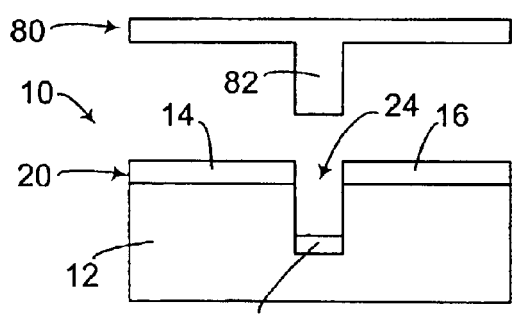

In step 74, the conductive material layer is patterned so as to form the separate source 14 and drain 16 (FIG. 1) from the unitary conductive material layer 20. An exemplary method for patterning the conductive material is by embossing the device with a patterned tool. Such embossing is illustrated in FIGS. 3–5. Referring first to FIG. 3, a tool 80 has a protrusion 82 for driving a portion of the conductive material layer 20 into the substrate 12. The tool 80 may be a part of a thin endless flexible metal belt that is used to emboss the transistor device 10. The tool 80 may be heated prior to being brought into contact with the transistor device 10. For example, the tool 80 may be heated above the softening temperature (or above the glass transition temperature) of material of the substrate 12. Thus, it will be appreciated that the tool 80 may be made of a thermally-conductive material, such as a metal. For example, the tool 80 may have a nickel or copper surface, and may be backed by a flexible material, such as rubber. In addition, it will be appreciated that the device 10, in particular the substrate 12, may be pre-heated, prior to being brought into contact with the tool 80.

Turning now to FIG. 4, the tool 80 is brought into contact with the device 10. The conductive material fragment is driven into the substrate 12, thereby deforming the substrate 12, and separating the source 14 from the drain 16, with the gap 24 therebetween. As stated above, the patterning may be part of a roll-to-roll process with the tool 80 and the device 10 pressed together, for example, by means of rollers. Alternatively, it will be appreciated that other means may be utilized to press the tool 80 into the device 10, for example, using other suitable types of presses.

As described further below, a belt that includes the tool 80 may move around two rollers that advance the belt at a predetermined linear controlled speed or rate. One of the rollers may be heated and the other roller may be cooled. An additional cooling station, e.g. one that blows cool air, may be provided between the two rollers. Pressure rollers are arranged about a portion of the circumference of the heated roller. Embossing occurs on a web of semiconductor material as it and the tool 80 pass around the heated roller and while pressure is applied by one or more pressure rollers causing the film to be melted and pressed onto the tool. A backing belt or film, such as one made of Mylar®, may be pressed against the non-embossed surface of the film. The embossed film (which may have been laminated to other films during the embossing process) is cooled, monitored for quality and then moved to a storage winder. At some point in the process, the Mylar® film may be stripped away from the embossed film.

As illustrated in FIG. 5, the tool 80 is then removed from the device 10. Suitable types of cooling may be utilized prior to the removal, in order to ensure that the substrate 12 is sufficiently cooled so as to maintain the gap 24 between the source 14 and the drain 16. The gap 24 may have a width between the source 14 and the drain 16 of less than 1 μm (micron), although it will be appreciated that other widths may be utilized.

It will be appreciated that the patterning of the conductive layer may include patterning multiple transistor devices that are part of a larger structure. That is, while only one transistor is shown as part of the transistor device 10, there may be numerous transistors that are part of the device 10. The embossing to separate the source 14 and the drain 16 may also serve to separate different transistors on the same substrate.

Figure 6:
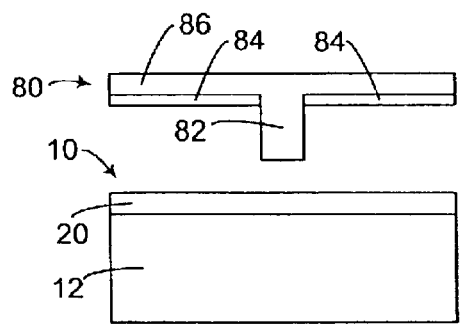
FIG. 6 illustrates an alternative embossing tool for separating the source and the drain.
Figure 8:
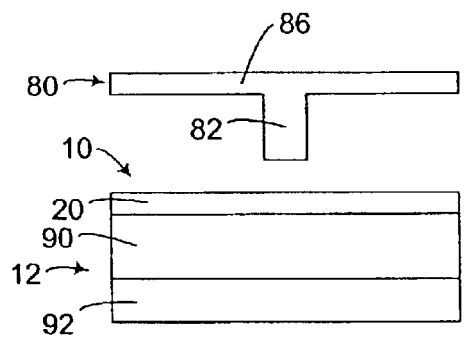
FIG. 8 is a side view illustrating an alternative transistor device having layers with different melting and/or glass transition temperatures.
Figure 7:
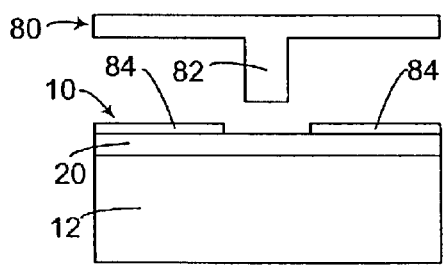
FIG. 7 is a side view illustrating a transistor device with spacers to insulate and/or protect portions of the transistor device of FIG. 1.

FIGS. 6–8 illustrate some possible variations for the patterning of step 74. FIG. 6 shows a tool 80 which includes spacers 84 on either side of the protrusion 82. The spacers 84 may include a thermally-insulative material. The term "thermally-insulative material," as used herein, is intended to distinguish the thermal insulation properties of the spacers 84 relative to that of the protrusion 82. By providing thermal insulation in the area of the spacers 84, protection may be provided to areas of the transistor device 10 which are not embossed by the protrusion 82 or other part of the tool 80. Such protection may minimize heating to these unembossed areas, thus avoiding thermal damage or other changes to the electrically-conductive material layer 20 and/or the substrate 12 in the vicinity of the unembossed areas. In addition, the spacers 84 may improve performance by providing for better heating of the protrusion 82 of the tool 80. By preventing heat loss from the regions of the tool 80 covered by the spacers 84, additional energy may be available for maintaining the temperature of the protrusion 82. Further, the spacers 84 may be utilized to control the amount that the protrusion 82 is inserted into the substrate 12. By monitoring pressure within the spacers 84, it may be possible to determine when the protrusion 82 is fully inserted in to the substrate 12. Thus, better control may be had regarding achieving the desired depth of the gap 24.

The spacers 84 may include a suitable plastic material that has a melting temperature, glass transition temperature, and/or softening temperature significantly above that of the substrate 12. Examples of such materials are polyester Mylar; PEN; poly ether ether-ketone; thermoplastic polyimide (Imidex); and polyimide (Kapton). The spacers 84 may be part of an insulative material layer that is joined to a base 86 of the tool 80. Further, the spacers 84 may include a suitable thermoset material, and/or a suitable non-polymeric material. The spacers 84 may be joined to the base 86 by pressing a layer of the material of the spacers 84 onto the other parts of the tool 80. This pressing may be accomplished use of heated rollers to press the spacer material onto the remainder of the tool 80. The protrusions 82 pass through the layer of spacing material, leaving an insulative layer of the spacers 84 covering other parts of the base 86.

It will be appreciated that suitable embossing processes and apparatus for forming precision optical patterns such as microstructures, may be utilized for forming the tool 80 having the spacers 84. Examples of such processes and apparatus are found in U.S. Pat. Nos. 4,486,363; 4,478,769; 4,601,861; 5,213,872; and 6,015,214, which patents are all incorporated herein by reference.

The spacers 84 on the tool 80 may be used to provide differentiation of surface temperature of the tool 80 during operation. The portions of the tool 80 covered by the spacers 84 may provide a cooler, more insulated contact surface than the portions of the tool 80 not covered by the spacers 84, such as the protrusion 82. Thus the spacers 84 may facilitate focusing heating of the device 10 in the areas where the heating is most desired, that is, in the areas of the device 10 that are to be embossed, by providing a higher temperature and greater thermal conductivity at the protrusions 82, relative to the portions of the base 86 covered by the spacers 84.

Alternatively, as shown in FIG. 7, the spacers 84 may be attached or otherwise coupled to the conductive material layer 20. It will be appreciated that the spacers 84 need not fully cover the unembossed areas of the transistor device 10 in order to be effective.

The spacers 84 on the device 10 may be made of the same or of a different material than the spacers 84 that are part of the tool 80. It will be appreciated that the spacers 84 that are adhered to the device 10 may be removed subsequent to the embossing of the device 10. Alternatively, it will be appreciated that the spacers 84 may be left in place as part of the final transistor device 10.

Turning now to FIG. 8, another arrangement is shown for limiting the amount of insertion of the protrusion 82 into the device 10. The substrate 12 of the device 10 shown in FIG. 8 has multiple layers, a top or upper layer 90 and a bottom or lower layer 92. The top layer 90 is located between the conductive material layer 20 and the bottom layer 92 of the substrate 12. The top layer 90 has a lower melting temperature than the bottom layer 92. Alternatively, the top layer 90 may have a lower glass transition temperature and/or softening temperature than the bottom layer 92. The protrusion 82 of the tool 80 may be heated to a point where it is above the melting temperature, glass transition temperature, and/or softening temperature of the top layer 90, yet below the melting temperature, glass transition temperature, and/or softening temperature of the bottom layer 92. When inserted into the device 10, the protrusion 82 is pressed into the top layer 90, yet is prevented from entering into the bottom layer 92 by being at a lower temperature then the melting temperature, glass transition temperature, and/or softening temperature of the bottom layer 92. Thus, insertion of the protrusion 82 of the tool 80 is limited. The thicknesses of the top layer 90 and the bottom layer 92 may be selected such that only the protrusion 82 of the tool 80 comes into contact with the device 10, with the tool base 86 of the tool 80 not coming into contact with the device 10.

Figure 9:
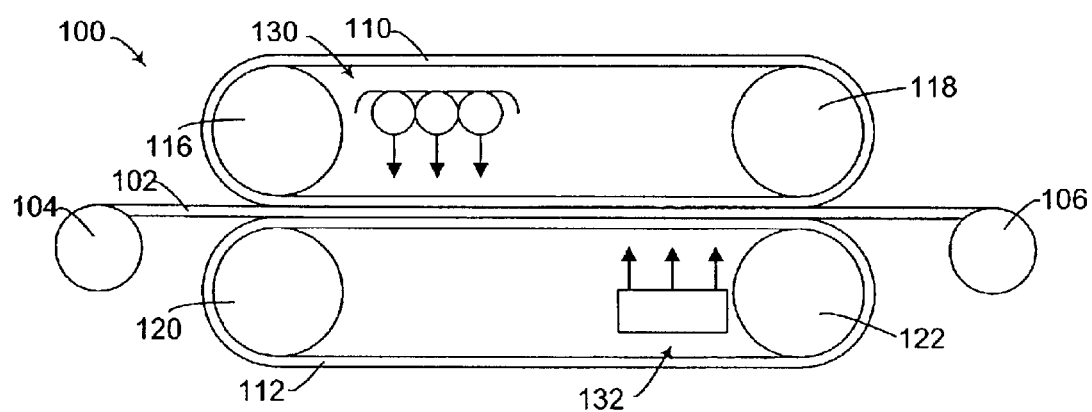
FIG. 9 is a schematic drawing illustrating a system for performing the embossing illustrated in FIGS. 3–5.

Turning now to FIG. 9, a system 100 is shown for embossing the device 10. The device 10, and similar such devices, are part of a continuous web 102. The web 102 travels from a supply roll 104 to a take-up roll 106. The web 102 is pressed between a tooling belt 110 and a second belt 112. The tooling belt 110 is supported by a pair of rollers 116 and 118, and the second belt 112 is similarly supported by a pair of rollers 120 and 122. The tooling belt 110 includes protrusions such as the protrusion 82 (FIG. 3) described above. The second belt 112 may be a smooth belt. The rollers 116–122 may be suitably heated and/or cooled to maintain the belts 110 and 112 at a desired temperature. In addition, there may be a heating zone 130 and/or a cooling zone 132 to control temperature of the belts 110 and 112, and the web 102, at various stages of the embossing.

As the web 102 proceeds from the supply roll 104 to the take-up roll 106, it is squeezed between the belts 110 and 112, being heated and embossed by the tooling belt 110. The web 102 may then be sufficiently cooled prior to disengaging from the belts 110 and 112.

Considering now the material for the web 102 in greater detail, for purposes of the present invention, two temperature reference points are used: $T_g$ and $T_e$.

$T_g$ is defined as the glass transition temperature, at which plastic material will change from the glassy state to the rubbery state. It may comprise a range before the material may actually flow.

$T_e$ is defined as the embossing or flow temperature where the material flows enough to be permanently deformed by the continuous press of the present invention, and will, upon cooling, retain form and shape that matches or has a controlled variation (e.g., with shrinkage) of the embossed shape. In general $T_e$ will vary from material to material and also will depend on such factors as the thickness of the film material, the embossing pressure, and the aspect ratio (depth-to-width ratio) of embossed features (such as the gap 24 (FIG. 1)). Therefore the exact $T_e$ temperature is related to conditions including the embossing pressure(s); the temperature input of the continuous press and the press speed, as well as the extent of both the heating and cooling sections in the reaction zone.

The embossing temperature may be high enough to exceed the glass transition temperature $T_g$, so that adequate flow of the material can be achieved to provide highly accurate embossing of the film by the continuous press. Alternatively, with high enough embossing pressure, the material may be sufficiently soft at a temperature around the glass transition temperature, so as to allow the material to be deformed without necessarily flowing.

Numerous thermoplastic materials may be considered as suitable polymeric materials for use in the web 102. However, not all can be embossed on a continuous basis. Applicants have experience with a variety of thermoplastic materials to be used in continuous embossing under pressure at elevated temperatures. These materials include thermoplastics of a relatively low glass transition temperature (up to 302° F./150° C.), as well as materials of a higher glass transition temperature (above 302° F./150° C.).

Typical lower glass transition temperature (i.e. with glass transition temperatures up to 302° F./150° C.) include materials used for example to emboss cube corner sheeting, such as vinyl, polymethyl methacrylate, low $T_g$ polycarbonate, and acrylonitrile butadiene styrene (ABS). The glass transition $T_g$ temperatures for such materials are 158° F., 212° F., 302° F., and 140° to 212° F. (70° C., 100° C., 150° C., and 60° to 100° C.).

Higher glass transition temperature thermoplastic materials (i.e. with glass transition temperatures above 302° F./150° C.) that have been found suitable for embossing precision structures, are disclosed in a co-pending patent application, U.S. Ser. No. 091776,281, filed Feb. 2, 2001. These polymers include polysulfone, polyarylate, cyclo-olefinic copolymer, high $T_g$ polycarbonate, and polyether imide.

A table of exemplary thermoplastic materials, and their glass transition temperatures, appears below as Table 1:

TABLE I

| Symbol | Polymer Chemical Name | $T_g$ ° C. | $T_g$ ° F. |
|---|---|---|---|
| PVC | Polyvinyl Chloride | 70 | 158 |
| Phenoxy | Poly (Hydroxyether) | 95 | 203 |
| PMMA | Polymethyl methacrylate | 100 | 212 |
| BPA-PC | Bisphenol-A Polycarbonate | 150 | 302 |
| COC | Cyclo-olefinic copolymer | 163 | 325 |
| PSF | Polysulfone | 190 | 374 |
| Polyarylate | Polyarylate | 210 | 410 |
| Hi-$T_g$-PC | High $T_g$ polycarbonate | 260 | 500 |
| PEI | Polyether imide | 215 | 500 |
| Polyurethane | Polyurethane | varies | varies |
| ABS | Acrylonitrile Butadiene Styrene | 60–100 | 140–212 |

The thermoplastic sheeting also may comprise a filled polymeric material, or composite, such as a microfiber filled polymer, and may comprise a multilayer material, such as a coextrudate of PMMA and BPA-PC.

A variety of thermoplastic materials such as those listed above in Table 1 may be used for the formation of embossed structures using the method 70 described above. Relatively low $T_g$ thermoplastic materials such as polymethyl methacrylate, ABS, polyurethane and low $T_g$ polycarbonate may be used in the system 200. Additionally, relatively high $T_g$ thermoplastic materials such as polysulfone, polyarylate, high $T_g$ polycarbonate, polyetherimide, and copolymers also may be used in an embossing system or press. Applicants have observed as a rule of thumb that for good fluidity of the molten thermoplastic material in the reaction (embossing) zone, the embossing temperature $T_e$ should be at least 50° F. (10° C.), and advantageously between 100° F. to 150° F. (38° C. to 66° C.), above the glass transition temperature of the amorphous thermoplastic sheeting. However, it will be appreciated that achieving fluidity is not an absolute requirement, and that achieving a temperature of about the glass transition temperature may sufficiently soften the material.

In addition to the amorphous thermoplastic materials described above, suitable crystalline thermoplastic materials may be utilized. Crystalline thermoplastic materials in general have a low $T_g$ and a high $T_m$ (melting temperature), relative to amorphous thermoplastic materials. An example of a suitable crystalline thermoplastic material is Nylon 6, which has a $T_g$ of 50° C. and a $T_m$ of 210° C. In embossing crystalline thermoplastic materials, $T_m$, rather than $T_g$, is the determining factor.

With such thermoplastic material the pressure range is approximately 150 to 700 psi (1.03 to 4.82 MPa), and potentially higher, depending on factors such as the operational range of the continuous press; the mechanical strength of the embossing belt (high pressure capacity); and the thermoplastic material and thickness of the thermoplastic film.

It is desirable that the material, after being exposed to heat and pressure, be cooled under pressure so as to compensate for the shrinkage and maintain good dimensional stability and accuracy. Thus, it is contemplated that the cooling station will be maintained in the range of 32° F. to 41° F. (0° C. to 5° C.) and the pressure range approximately 150 to 700 psi (1.03 to 4.83 MPa). The pressure in the reaction zone will be similar for heating and cooling.

Embossing equipment of the form described above is termed a continuous press machine. An example of such a machine is disclosed in co-pending U.S. application Ser. No. 09/596,240, filed Jun. 16, 2000, entitled "A Process for Precise Embossing", and commonly assigned, incorporated herein by reference.

Figure 10:
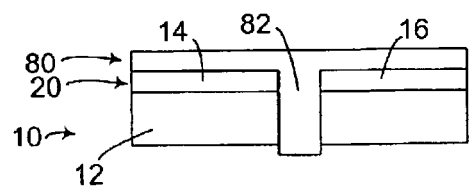
FIGS. 10 and 11 are side views illustrating yet another alternative embossing of the transistor device of FIG. 1.

It will be appreciated that the configuration shown in FIG. 10 is but one example of many suitable ways of embossing in a roll-to-roll operation. Many other alternatives may be employed. For example, a web of material may be embossed by a roller with a textured surface, dispensing with the need for a tooling belt. As another alternative, a nip roller may be used to provide sufficient pressure by pressing the web against a textured belt or roller surface. Furthermore, it will be appreciated that the embossing process may be combined with other roll-to-roll operations in the manufacture of the device 10. As another example of an alternative, the number or type of rollers may be varied.

As further alternatives, the heating and cooling of the material may vary from that described above. For example, a surface of the web may be heated prior to contact with a tool. Such heating may be accomplished by any of a variety of suitable methods, such as a heating zone or various types of suitable means of localized heaters, such as infrared heaters. The surface of the web may then be brought into contact with the tool in order to emboss the surface of the web. The tool may be heated as well. Alternatively, the tool may be cooled or left at an ambient temperature.

Further details regarding other embossing systems may be found in U.S. Pat. Nos. 4,486,363 and 4,601,861, both of which are incorporated herein by reference in their entireties.

Also, it will be appreciated that the embossing or patterning of the device 10 may be performed other than as a roll-to-roll operation. For example, a simple press, such as a punch press, may be employed. A platen press is another alternative. Thus the tool 80 may be part of a rigid plate, and the spacers 84 may also be part of the rigid plate.

Figure 11:
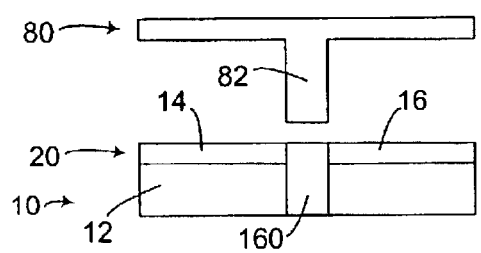

FIGS. 10 and 11 illustrate another alternative in the embossing process, wherein the protrusion 82 of the tool 80 passes entirely through the substrate 12. As shown in FIG. 11, a hole 160 is thus produced in the device 10. The alternative arrangement shown in FIGS. 10 and 11 avoids the presence of a conductive material fragment 22 (FIG. 1) within the substrate 12.

With reference again to FIG. 2, following patterning of the conductive material, such as by embossing, in step 74, the semiconductor material 28 is deposited in step 164. As noted above, the semiconductor material 28 may be any of a variety of suitable polymeric semiconductor materials. The semiconductor material 28 may be deposited by a printing operation, such as any of the suitable printing operations described above. Alternatively, it will be appreciated that other suitable semiconductor materials and/or deposition methods may be employed. For example, processes such as Gravure coating or other types pattern coating may be utilized.

The gate dielectric 30 is then deposited in step 168. Following that, the gate 34 (FIG. 1) is formed, in step 170. The deposit of the gate dielectric 30 and the formation of the gate 34 may be accomplished by traditional suitable means. One or more of the gate dielectric 30 and the gate 34 may be printed using suitable printing techniques. In addition, it will be appreciated that the gate 34 may be patterned, for example, by suitable lithography techniques, thereby removing undesired parts of a gate material layer.

Figure 12:
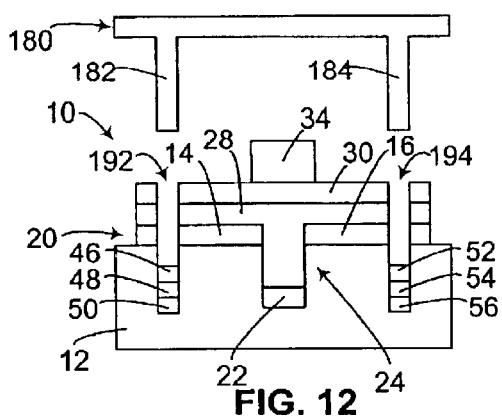
FIG. 12 is a side view illustrating embossing to form source and drain contacts of the transistor device of FIG. 1.

Following formation of the gate, the source contact 40 and the drain contact 42 (FIG. 1) are formed, by creating via holes in step 174, and by filling the via holes with conductive material, in step 178. The creation of the via holes is illustrated in FIG. 12, wherein a tool 180 with protrusions 182 is used to create via holes 192 and 194. The pressing of the tool 180 into the device 10 pushes fragments of material into the substrate 12. Thus, source-side fragments 46–48 and drain-side fragments 52–56 are pressed into the substrate 12. It will be appreciated that the embossing methods described above for formation of the gap 24 (FIG. 1) between the source 14 and the drain 16 (FIG. 1), may also be used to press the tool 180 into the device 10 to form the via holes 192 and 194.

Following formation of the via holes 192 and 194, the via holes may be filled with a conductive material to form the source contact 40 and the drain contact 42. The conductive material may be any of a variety of suitable conductive materials, such as doped semiconductor materials, for instance a polymeric semiconductor material. The filling may be accomplished by suitable printing methods, or by other suitable methods.

It will be appreciated that the formation of the contacts 40 and 42 alternatively may be formed prior to the formation of the gate 34.

It will be appreciated that some simple devices may not require contacts such as the contact 40 and 42 shown in FIG. 1, the formation of which is described above. For example, devices without multiple conductor layers or inter-layers may not require contacts with conductor-filled via holes.

Further, it will be appreciated that multiple of the above steps may be combined in a single roll-to-roll process.

Figure 13:
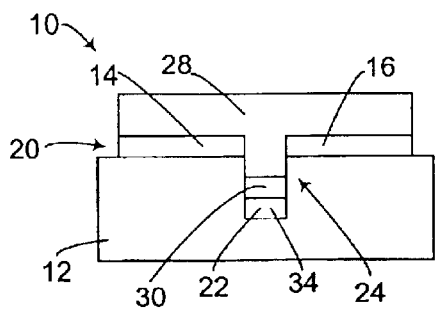
FIG. 13 is a side view of an alternative transistor device in accordance with the present invention, the device having a bottom gate.

Turning now to FIG. 13, an alternative embodiment of the transistor device 10 is shown, which utilizes the conductive material fragment 22 as at least part of the gate 34. The gap 24 in the substrate 12 and/or between the source 14 and the drain 16 is partially filled by a gate dielectric 30 that is atop the conductive material fragment. It will be appreciated that this bottom gate conductive material fragment 22, 34 may be coupled to a voltage source, for example, using suitable conductor-filled vias. Thus, the conductive material fragment 22 itself operates as the gate 34 that is operatively coupled to, and controlling conductance between, the source 14 and the drain 16.

Further steps in fabrication of the bottom-gate device may be similar to some of those described above with regard to top gate devices. For instance, source and drain contacts may be formed in a many similar to that described with regard to FIG. 12.

It will be appreciated that the above-described methods may allow production of improved transistor devices. Transistor devices such as the ones described above may involved reduced manufacture expense and/or complexity, and may involve inexpensive transistors with smaller channel lengths.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions preformed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the discarded structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be described and advantageous for any given or particular application.

What is claimed is:

1. A method of making a transistor device comprising:

depositing an electrically-conductive material layer on a substrate:

pressing an electrically-conductive material fragment of the electrically-conductive material layer into the substrate, thereby separating the electrically-conductive material layer into a source and a drain;

depositing a semiconductor material into a gap between the source and the drain; and operatively coupling a gate to the source and the drain.

2. The method of claim 1, wherein the operatively coupled the gate includes:

depositing a gate dielectric over the source, the drain, and the semiconductor material; and forming a gate on the gate dielectric, wherein the gate is operatively coupled to the source and the drain.

3. The method of claim 1, wherein the pressing further includes pressing the conductive material fragment through the substrate.

4. The method of claim 1, wherein the pressing includes embossing the device with a patterned tool.

5. The method of claim 4, wherein the embossing includes a roll-to-roll embossing process.

6. The method of claim 4, further including heating at least part of the patterned tool prior to the pressing.

7. The method of claim 4, wherein the tool includes at least one tool protrusion that presses the conductive material fragment and forms the gap between the source and the drain.

8. The method of claim 7, wherein the patterned tool includes a heat conductive material; and wherein the embossing includes pressing thermally-insulative spacers between the heat conductive material and the electrically-conductive material layer along unembossed areas of the electrically-conductive material layer.

9. The method of claim 8, wherein the spacers are attached to the unembossed areas of the electrically-conductive material layer.

10. The method of claim 8, wherein the spacers are part of the tool.

11. The method of claim 10, wherein the tool further includes a base that the at least one protrusions protrudes from; and wherein the spacers are part of an insulative layer that covers the base except where the at least one protrusion is attached to the base.

12. The method of claim 8, wherein the substrate includes an upper layer and a lower layer;

wherein the upper layer of the substrate is interposed between the electrically-conductive material layer and the lower layer of the substrate; and wherein the upper layer has a lower melting temperature than the lower layer.

13. The method of claim 12, wherein the embossing includes pressing the tool protrusion into the upper layer but not into the lower layer.

14. The method of claim 13, wherein a tool base of the tool does not contact the transistor device.

15. The method of claim 8, wherein the substrate includes an upper layer and a lower layer;

wherein the upper layer of the substrate is interposed between the electrically-conductive material layer and the lower layer of the substrate; and wherein the upper layer has a lower glass transition temperature than the lower layer.

16. The method of claim 15, wherein the embossing includes pressing the tool protrusion into the upper layer but not into the lower layer.

17. The method of claim 16, wherein a tool base of the tool does not contact the transistor device.

18. The method of claim 4, further comprising heating of a surface of the device prior to embossing.

19. The method of claim 18, further including heating at least part of the patterned tool prior to the pressing.

20. The method of claim 18, further including cooling at least part of the patterned tool prior to the pressing.

21. The method of claim 1, wherein the depositing the semiconductor material includes printing the semiconductor material.

22. The method of claim 1, wherein the semiconductor material is a polymeric semiconductor material.

23. The method of claim 1, wherein the depositing the electrically-conductive material layer includes printing a conductive ink on the substrate.

24. The method of claim 23, wherein the printing the conductive ink includes printing an ink containing silver particles.

25. The method of claim 1, wherein the depositing the electrically-conductive material layer includes depositing the electrically-conductive material layer such that is from 0.1 to 20 $\mu$m (microns) thick.

26. The method of claim 1, further comprising, prior to the depositing the semiconductor material, depositing a dielectric material over the electrically-conductive material fragment.

27. The method of claim 26, wherein the electrically-conductive material fragment is at least part of a gate that is operatively coupled to the source and the drain.

28. The method of claim 1, further comprising forming a source contact for making electrical connections to the source, and a drain contact for making electrical connections to the drain.

29. The method of claim 28, wherein the source contact and the drain contact pass through the semiconductor layer.

30. The method of claim 28, wherein the forming the source contact and the drain contact includes:

making a source via hole in communication with the source, and a drain via hole in communication with the drain; and filling the via holes with conductive material.

31. The method of claim 30, wherein the making the via holes include embossing.

32. The method of claim 31, wherein the embossing to make the via holes includes a roll-to-roll process.

33. The method of claim 1, wherein the fragment has a width of 1 µm (micron) or less, and wherein the gap therefore has a width of 1 µm (micron) or less.

34. The method of claim 1, wherein the depositing the semiconductor material includes also depositing the semiconductor material upon the source and the drain.

35. A method of making a transistor device comprising:
   embossing an electrically-conductive material layer on a substrate to separate the electrically-conductive material layer into a source and a drain;
   depositing a semiconductor material into a gap between the source and the drain; and
   forming a source contact and a drain contact, wherein the forming includes:
      making a source via hole in communication with the source, and a drain via hole in communication with the drain; and
      filling the via holes with conductive material.

* * * * *